(12) United States Patent
Cooksey et al.

(10) Patent No.: US 9,162,226 B2
(45) Date of Patent: Oct. 20, 2015

(54) FOLDABLE MICROFLUIDIC DEVICES USING DOUBLE-SIDED TAPE

(75) Inventors: Gregory A. Cooksey, Gaithersburg, MD (US); Francisco Javier Atencia-Fernandez, Gaithersburg, MD (US)

(73) Assignees: The United States of America, as represented by the Secretary of Commerce, Washington, DC (US); The National Institute of Standards and Technology, Gaithersburg, MD (US)

( * ) Notice: Subject to any disclaimer, the term of this patent is extended or adjusted under 35 U.S.C. 154(b) by 141 days.

(21) Appl. No.: 13/470,126

(22) Filed: May 11, 2012

(65) Prior Publication Data

US 2012/0285560 A1 Nov. 15, 2012

Related U.S. Application Data

(60) Provisional application No. 61/485,554, filed on May 12, 2011.

(51) Int. Cl.
*F15B 21/00* (2006.01)
*B29C 53/04* (2006.01)
(Continued)

(52) U.S. Cl.
CPC ..... *B01L 3/502738* (2013.01); *B01L 3/502707* (2013.01); *B81C 1/00119* (2013.01); *B01L 3/5055* (2013.01); *B01L 2300/0816* (2013.01); *B01L 2300/0887* (2013.01); *B29C 65/483* (2013.01); *B29C 65/4815* (2013.01); *B29C 65/4825* (2013.01); *B29C 65/4855* (2013.01); *B29C 65/5021* (2013.01); *B29C 65/5057* (2013.01); *B29C 66/4322* (2013.01);

(Continued)

(58) Field of Classification Search
CPC ............... B01L 3/502707; B01L 3/502738; B01L 3/5055; B01L 2300/0816; B01L 2300/0887; B81C 1/00119; B81B 2201/054; B29C 65/5057; B29C 65/4855; B29C 65/5021; B29C 65/4815; B29C 65/4825; B29C 65/483; B29C 66/4326; B29C 66/71; B29C 66/4322; B29K 2083/00
USPC ............ 137/315.01, 803, 833, 828; 251/368; 422/502, 503, 504, 505, 506, 507, 508; 156/227
See application file for complete search history.

(56) References Cited

U.S. PATENT DOCUMENTS 5,792,943 A * 8/1998 Craig ........................... 73/61.52
6,536,477 B1 3/2003 O'Connor et al.
(Continued)

OTHER PUBLICATIONS

Hosokawa, K. et al., "A pneumatically-actuated three-way microvalve facbricated with polydimethylsiloxane using the membrane transfer technique," J. Micromech. Microeng. (2000) 10:415-420.
(Continued)

*Primary Examiner* — John K Fristoe, Jr.
*Assistant Examiner* — Kevin Barss
(74) *Attorney, Agent, or Firm* — Kevin Soules; Kermit D. Lopez; Luis M. Ortiz

(57) ABSTRACT

A method and system for a folding microfluidic device comprises creating at least one folding line in a material, forming a plurality of layers of a microfluidic device in said material, and folding the material at the fold lines to create a self-aligned multilayered microfluidic device. The material can comprise a carrier material with an adhesive layer on the top and bottom surfaces.

14 Claims, 8 Drawing Sheets

(51) Int. Cl.
*B01L 3/00* (2006.01)
*B81C 1/00* (2006.01)
*B29C 65/50* (2006.01)
*B29C 65/00* (2006.01)
*B29L 31/00* (2006.01)
*B29C 65/48* (2006.01)

(52) U.S. Cl.
CPC ............ *B29C66/4326* (2013.01); *B29C 66/71* (2013.01); *B29L 2031/756* (2013.01); *B81B 2201/054* (2013.01); *Y10T 137/85938* (2015.04); *Y10T 156/1049* (2015.01)

(56) References Cited

U.S. PATENT DOCUMENTS

| | | | |
|---|---|---|---|
| 6,626,417 B2 | 9/2003 | Winger et al. | |
| 6,803,019 B1* | 10/2004 | Bjornson et al. | 422/66 |
| 6,848,462 B2 | 2/2005 | Covington et al. | |
| 6,899,137 B2 | 5/2005 | Unger et al. | |
| 7,318,912 B2* | 1/2008 | Pezzuto et al. | 422/504 |
| 7,607,641 B1* | 10/2009 | Yuan | 251/331 |
| 7,919,062 B2 | 4/2011 | Yuen | |
| 7,935,319 B2* | 5/2011 | Andersson et al. | 422/506 |
| 2002/0112961 A1 | 8/2002 | O'Connor et al. | |
| 2004/0209354 A1* | 10/2004 | Mathies et al. | 435/287.2 |
| 2005/0079104 A1* | 4/2005 | Polwart et al. | 422/100 |
| 2005/0089449 A1 | 4/2005 | Polwart et al. | |
| 2007/0003444 A1 | 1/2007 | Howell et al. | |
| 2007/0003448 A1* | 1/2007 | Kanigan et al. | 422/102 |
| 2007/0034269 A1* | 2/2007 | Nagai et al. | 137/827 |
| 2008/0280112 A1* | 11/2008 | Langereis et al. | 428/201 |
| 2009/0022628 A1* | 1/2009 | Polwart et al. | 422/82.02 |
| 2009/0178934 A1* | 7/2009 | Jarvius et al. | 205/777.5 |
| 2009/0185955 A1* | 7/2009 | Nellissen | 422/68.1 |
| 2010/0018584 A1* | 1/2010 | Bransky et al. | 137/2 |
| 2010/0061892 A1* | 3/2010 | Flaim et al. | 422/68.1 |
| 2011/0028293 A1* | 2/2011 | Atkin et al. | 493/374 |

OTHER PUBLICATIONS

Polymeric Laminates, http://faculty.washington.edu/vagerp/microfluidicstutorial/polymericlaminates/polymericlaminates.htm.

Atencia, J. et al., "Magnetic connectors for microfluidic applications," Lab Chip (2010) 10:246-249.

Bartholomeusz, D. A. et al., "Xurography: Rapid Prototyping of Microstructures Using a Cutting Plotter," Journal of Microelectromechanical Systems (2005) 14(6):1364-1374.

Cooksey, G. A. et al., "A vacuum manifold for rapid world-to-chip connectivity of complex PDMS microdevices," Lab Chip (2009) 9:1298-1300.

* cited by examiner

FOLDABLE MICROFLUIDIC DEVICES USING DOUBLE-SIDED TAPE

CROSS-REFERENCE TO PROVISIONAL APPLICATION

This Application claims the benefit of priority based on U.S. Provisional Patent Application 61/485,554 filed May 12, 2011 entitled "FOLDABLE MICROFLUIDIC DEVICES USING DOUBLE-SIDED TAPE (INCLUDING MICROVALVES, MANIFOLDS, AND DEVICES WRAPPED IN 3 DIMENSIONS)". The above-referenced provisional patent application is hereby incorporated by reference in its entirety.

TECHNICAL FIELD

Embodiments are generally related to the field of microfluidic devices. More particularly, embodiments relate to methods and systems for constructing microfluidic devices using adhesive materials such as double-sided tapes and/or plastic laminates to create microvalves, manifolds, and three-dimensional devices.

BACKGROUND OF THE INVENTION

The field of Microfluidics has created a demand for micrometer-sized devices that can be used in a variety of applications from medicine to ink jet printing.

However, fabrication of such devices can be time consuming, complicated, and expensive. Therefore, a need exists for improved methods and systems for fabricating microfluidic devices.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for fabricating microfluidic devices.

It is another aspect of the disclosed embodiments to provide for an enhanced method and system for fabricating microfluidic devices with microvalves and pneumatic elements.

It is another aspect of the disclosed embodiments to provide an enhanced method and system for fabricating connector manifolds for microfluidic devices.

It is another aspect of the disclosed embodiments to provide an enhanced method and system for fabricating microfluidic devices which incorporate fluid flow in three-dimensional objects.

It is yet another aspect of the disclosed embodiments to provide for a method and system to deliver fluid to specific locations on a three-dimensional object.

The aforementioned aspects and other objectives and advantages can now be achieved as described herein. A method for fabricating microfluidic devices comprises creating folding lines in a sheet of material and forming a plurality of microfluidic device components in the material. The material is then folded at the fold lines. This folded material is then adhered together to thereby create a self-aligned microfluidic device.

The microfluidic device can comprise a plurality of layers of the material wherein the layers comprise at least one of polymers, plastics, elastomers, paper, adhesive layers, liners, foil, porous materials, glasses, and composites. The material is adhered using at least one of adhesive tapes, chemical adhesive, mechanical pressure, electrostatic attraction, melting, curable adhesive, epoxy, and urethane.

Forming the microfluidic device components further comprises forming at least one valve in at least one of the layers, such that the valve acts upon a fluid carried in one of the layers adjacent to the valve. A plurality of microfluidic device components are arranged in the material, and parts of the material are removed to form the microfluidic device components. A flexible membrane is inserted and the material is folded over the flexible membrane to create at least one microfluidic valve. The microfluidic valve can be a pull-open valve or a push-closed valve.

In an alternative embodiment of the invention sections of the material are removed to fit around and seal against at least one tubular enclosure. Next fold lines are arranged to provide self alignment around the tubular enclosure. Cutting at least one slot in the bottom of the last folded layer thereby creates a fluidic connection between an inlet or outlet of the microfluidic device and the tubular enclosure to allow a fluid to flow from the tubular enclosure to the inlet or outlet of the microfluidic device.

An alternative embodiment of the invention comprises arranging the fold lines to form a three dimensional shape by folding the material along the fold lines to form a three dimensional object comprised of the material wherein both the inside and outside surface of the three dimensional object are accessible by a fluid held in the walls of the three dimensional object. A plurality of properties of the fluid in the walls of the three dimensional object can be manipulated at different positions of the three dimensional object. These properties comprise at least one of fluid contents, flow rates, temperatures, viscosities, opacities, and fluid mixings.

In another embodiment of the invention a plurality of tabs are arranged on the material to provide an alignment guide when the material is folded at the fold lines.

In yet another embodiment of the invention a method for fabricating microfluidic devices comprises creating at least one folding line in a sheet of material, forming a plurality of microfluidic device components in the material, arranging a plurality of tabs on the material to provide an alignment guide, folding the material at the fold lines and according to the alignment guide, and adhering the folded material together to thereby create a self-aligned multilayered microfluidic device.

The method further comprises configuring the microfluidic device as a plurality of layers of the material, forming at least one valve in at least one of the layers, such that the valve acts upon at least one fluid carried in at least one of the layers adjacent to the valve, arranging a plurality of microfluidic device components in the material, removing parts of the material to form a plurality of microfluidic device components, arranging a flexible membrane, and folding the material over the flexible membrane to create at least one microfluidic valve. The microfluidic valve comprises at least one of a pull-open valve or a push-closed valve.

In an alternative embodiment of the invention sections of the material are removed to fit around and seal against at least one tubular enclosure. Next fold lines are arranged to provide self alignment around the tubular enclosure. Cutting at least one slot in the bottom of the last folded layer thereby creates a fluidic connection between an inlet of the microfluidic device and the tubular enclosure to allow a fluid to flow from the tubular enclosure to the inlet of the microfluidic device.

Another alternative embodiment of the invention comprises arranging the fold lines to form a three dimensional shape, folding the material along the fold lines to form a three dimensional object comprised of the material wherein both an inside surface of the three dimensional object and an outside surface of the three dimensional object are accessible by a fluid held in a wall of the three dimensional object. A plurality of properties of the fluid in the walls of the three dimensional object can be manipulated at different positions of the three dimensional object, those properties comprising at least one of fluid contents, flow rates, temperatures, viscosities, opacities, and fluid mixings.

In yet another embodiment a microfluidic device comprises a material configured to have a plurality of folding lines. A plurality of microfluidic device components are formed in the material. A plurality of tabs on the material provide an alignment guide when the material is folded at the fold lines. An adhesive binds the material after it is folded at the plurality of folding lines and adhered together to create a self-aligned multilayered microfluidic device.

The device further comprises a plurality of layers of the material wherein the layers comprise at least one of polymers, plastics, elastomers, paper, adhesive layers, liners, foil, porous, materials, glasses, and composites. The adhesive comprises at least one of adhesive tapes, chemical adhesive, mechanical pressure, electrostatic attraction, melting, curable adhesive, epoxy, and urethane.

In another embodiment the device further comprises at least one valve in at least one of the layers, such that the valve acts upon at least one fluid carried in the layers adjacent to the at least one valve. The material around the plurality of microfluidic device components is removed. A flexible membrane sealed between the at least two layers thereby creates at least one microfluidic valve. The valve can be a pull-open valve or a push-closed valve.

In another embodiment the device comprises the material formed with removed sections configured to fit around and seal against at least one tubular enclosure wherein the fold lines provide self alignment around the tubular enclosure. At least one slot is formed in a bottom of the last folded layer to thereby create a fluidic connection between an inlet of the microfluidic device and the at least one tubular enclosure, to allow a fluid to flow from the at least one tubular enclosure to the inlet of the microfluidic device.

In another embodiment the device comprises a three dimensional shape formed by the arrangement of the fold lines wherein the material is folded along the fold lines to form walls of a three dimensional object. A fluid is associated with the microfluidic device wherein in both an inside surface of the three dimensional object and an outside surface of the three dimensional object are accessible by the fluid held in the walls of the three dimensional object.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof. Various modifications to the preferred embodiments, disclosed herein, will be readily apparent to those of ordinary skill in the art and the disclosure set forth herein may be applicable to other embodiments and applications without departing from the spirit and scope of the present specification and the claims hereto appended. Thus, the present specification is not intended to be limited to the embodiments described, but is to be accorded the broadest scope consistent with the disclosure set forth herein.

Figure 1:
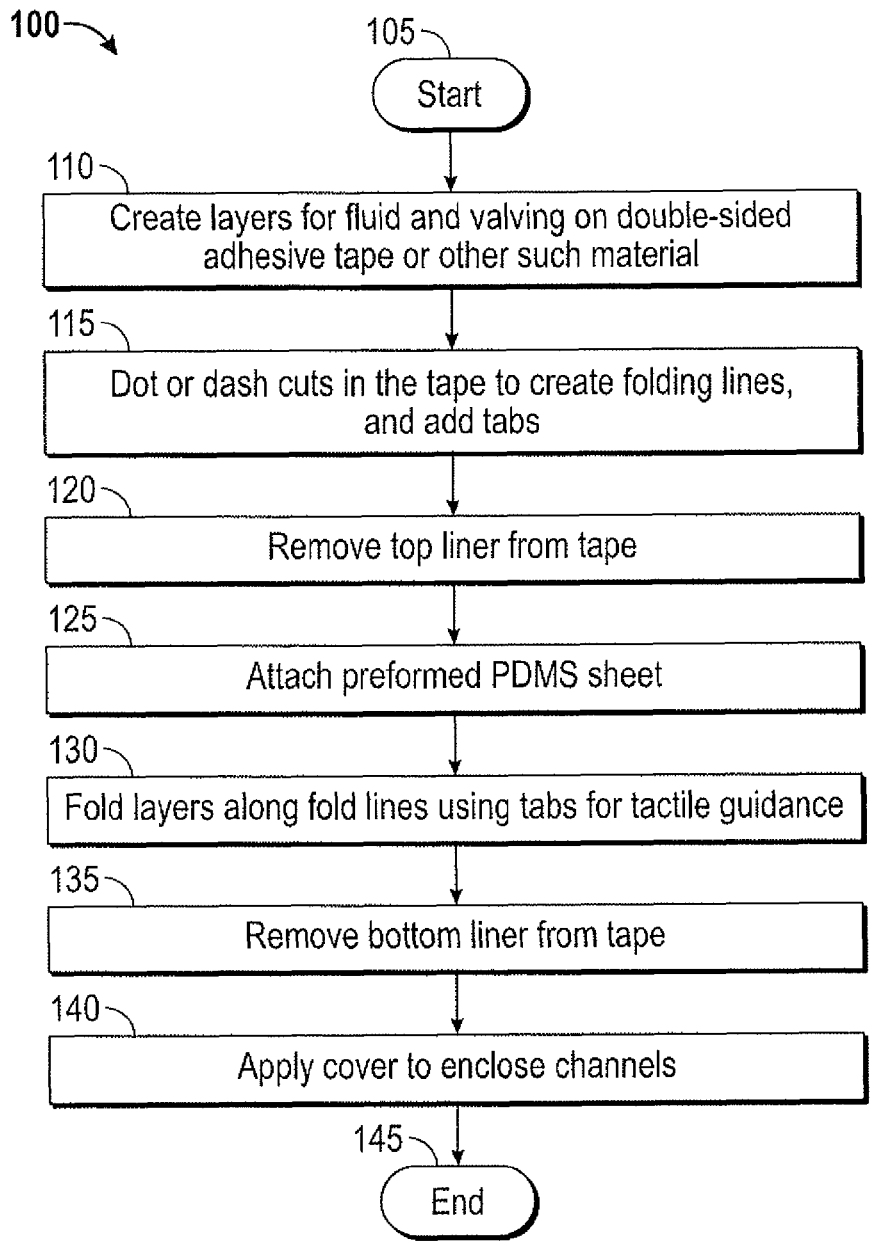
FIG. 1 depicts a high level flow chart illustrating logical operational steps for constructing a microfluidic device.

FIG. 1 illustrates a flow chart 100 of logical operational steps for fabricating a microfluidic device in accordance with an embodiment of the present invention. It should be appreciated that while FIG. 1 illustrates an exemplary series of steps for fabricating a microfluidic device the order of these steps can be equivalently preformed in an alternative order. The method begins at block 105.

Block 110 explains that layers for fluid and valving are created on a material typically less than 500 micrometers in thickness such that devices can be readily folded over a single fold line. This material can be polymers, plastics, elastomers (e.g. poly(dimethylsiloxane)), paper, adhesive, liners, foil, porous material, double-sided tape, glasses, and composites. These materials can be used in any of the embodiments of the invention described herein.

In the preferred embodiment illustrated in FIG. 1, double-sided tape is used. Double-sided tape typically includes a carrier material with an adhesive layer on the top and bottom and a removable liner covering the adhesive layers. Preferred double-sided tapes for all the embodiments described herein include double-sided silicone tape 3M 96042 or double-sided acrylic/silicone tape 3M 9731, but the choice of tape is dependent on the materials being used.

Microchannels are created by cutting out parts of the double-sided tape and covering it with a sheet of material—glass is preferable for the base, plastics can alternatively be used as the top or bottom cover. Microchannels can be created in plastics or other materials by embossing, etching, or other ablation method. Any number of microfluidic device components can be included on the tape. These might include, for example, microchannels, microvalves or other pneumatic elements, diffusion chambers, manifolds, holes that connect one layer to another (vias), inlet and outlet ports, and other microfluidic device components.

In the present invention, the double-sided tape can be perforated with doted or dashed cuts to create folding lines as described at block 115. This step also includes adding tabs along the edges of the tape. These tabs are configured to match with tabs on the opposite side of the folding lines to provide tactile alignment guides when the tape is folded.

At block 120 the top liner protecting the adhesive on the tape is removed and at block 125, a sheet of material, preferably an elastic material such as poly(dimethylsiloxane) ("PDMS"), is attached to the top adhesive surface of the tape as a membrane. PDMS is a silicone-based organic polymer that is generally accepted as non-toxic, non-flammable, and inert. In addition PDMS is viscoelastic making it an excellent choice for the present invention. It should be noted that any similar material could be used as the membrane described herein. In general, the membrane will only be placed over the valving layer or the fluid layer so that when the tape is folded at block 130, the membrane is sandwiched between the two sides. Depending on where the fluids and valving lines are connected to the device, vias may need to be created in the membrane to allow fluids to move from one layer to another.

It will be appreciated that any number of adhesion methods may be employed to bind the layers of material after folding at block 130. In the embodiment described by FIG. 1 adhesive tape is used. In an alternative embodiment the method of adhesion can be by chemical adhesive, mechanical pressure, electrostatic attraction, melting, curable adhesive, epoxy, urethane or other adhesive method.

After the membrane is attached, the tape can be folded along the fold lines as illustrated at block 130. The tabs included in step 115, can be used to ensure proper alignment of the folded sections of the tape.

After the tape is folded, the liner covering the bottom layer adhesive on the tape can be removed as shown at block 135. Block 140 describes that a one or more covers is then applied on or around the layers of adhesive to enclose the channels that have been created in the Microfluidic device. The cover(s) can be formed of plastic, PDMS or other such material. The cover(s) can contain inlet holes where fluid and valving inputs enter the microfluidic device. The method then ends at block 145.

Figure 2:
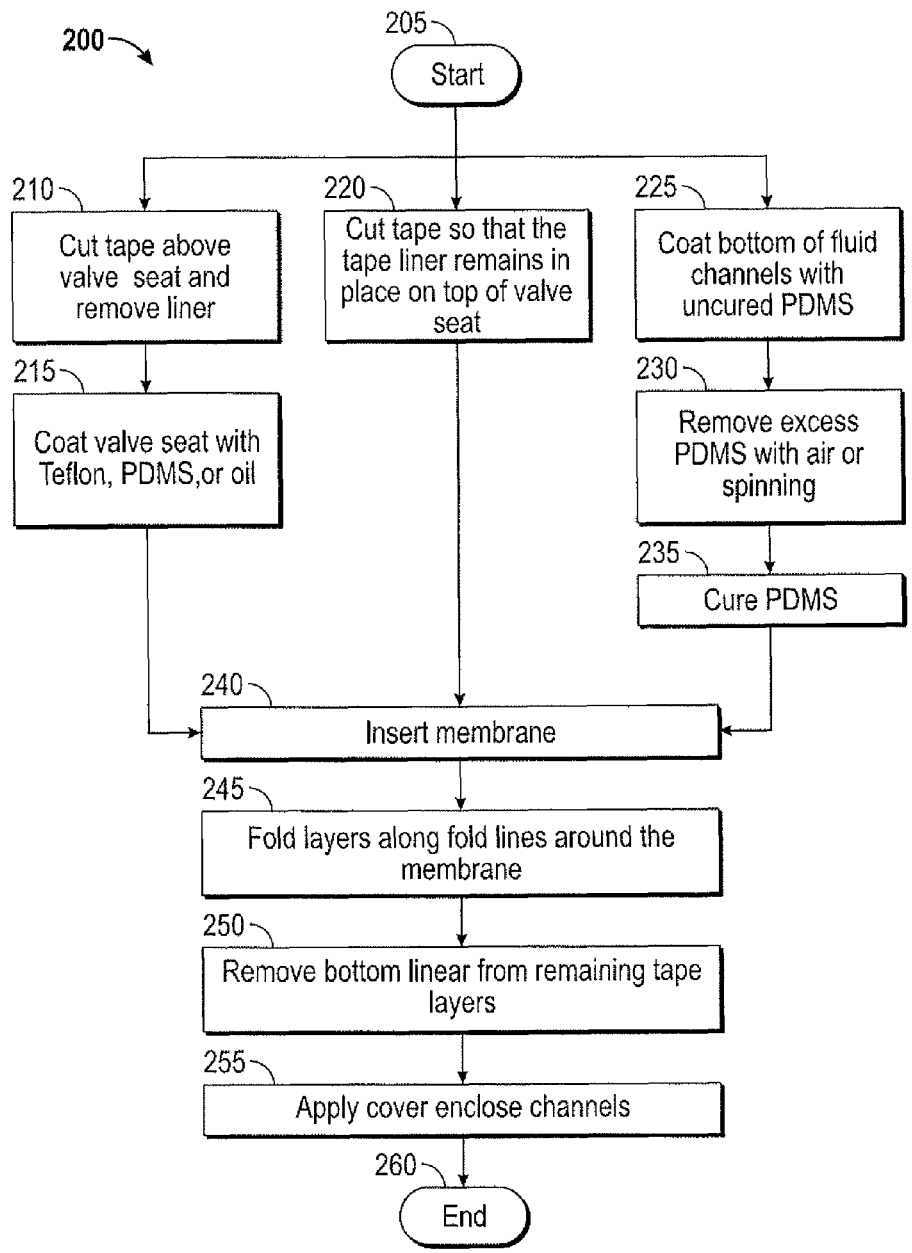
FIG. 2 depicts a detailed flow chart illustrating logical operational steps for creating microvalves associated with a microfluidic device.

FIG. 2 depicts a high level flow chart 200 of logical operational steps for fabricating microvalves or pneumatic elements in a microfluidic device in accordance with an embodiment of the present invention. Note that the steps illustrated in flow chart can be implemented in conjunction with, or in addition to, those steps shown in flow chart 100.

In general, microvalves can be formed by creating a fluid layer and a valving layer which are folded around a flexible membrane with vias according to the method described above with respect to FIG. 1. Microvalves can be formed as pull-open valves or push-closed valves. FIGS. 5*b* and 5*c* illustrate a pull-open microvalve.

The method 200 begins at block 205. In a preferred embodiment of the present invention a pull-open type microvalve can be created. At block 210, the double-sided tape, or other such material disclosed above, can have its liner cut away and removed above the valve seats. The rest of the tape remains covered by the liner. At block 215 the valve seat can be coated with nonstick coating such as Teflon spray, PDMS, or oil. These steps render the valve seat operable and prevent the tape at the valve seat from sticking to the membrane.

At block 240 the liner from this layer is removed and a membrane is inserted. The tape is then folded at block 245 to enclose the membrane between the fluid and valve channels. The other liner is then removed at block 250 and a cover with inlet holes is placed around the device to cover the tape as shown at block 255. This series of steps results in a completed pull-open microvalve. The method ends at block 260.

In another embodiment of the invention, for creating pull-open type microvalves, as shown at block 220, the tape liner is cut so that the liner remains in place on top of the valve seat. Next, after the top liner is removed, a membrane can be inserted at block 240 and sealed between the layers at block 245. As shown at block 250, the bottom liner can be removed and a cover can be applied to enclose the channels as depicted at block 255. The method ends at block 260

Finally, in another alternative embodiment of the invention for creating push-closed type microvalves, at 225 the bottom of the fluid channels can be coated with uncured PDMS or other such material. Block 230 illustrates that the excess PDMS is removed. This step can be accomplished using a spinning technique or using compressed air to blow the remaining material away. The PDMS or other such material can then be cured as shown at block 235 such that the bottom of the fluid channel is rounded, which enables the membrane to completely seal against the bottom of the fluid channel, thus completely closing the valve. In a related alternative embodiment of the invention, the bottoms of the channels in the fluid layer can be created to be naturally curved. This can be achieved by embossing or other such known method.

After the material is cured, the top liner is removed and a membrane can be inserted as shown at block 240. The membrane then is sealed between the layers at block 245. Finally, the bottom liner is removed at block 250 and a cover is applied at block 255 to enclose the channels. This series of steps can be used to form a push-closed valve. The method ends at block 250.

Incorporating microvalves and pneumatic elements is also facilitated by using the folding lines described above to self align the fluid and valve layers, which can be made of tape, or other such material.

Figure 3:
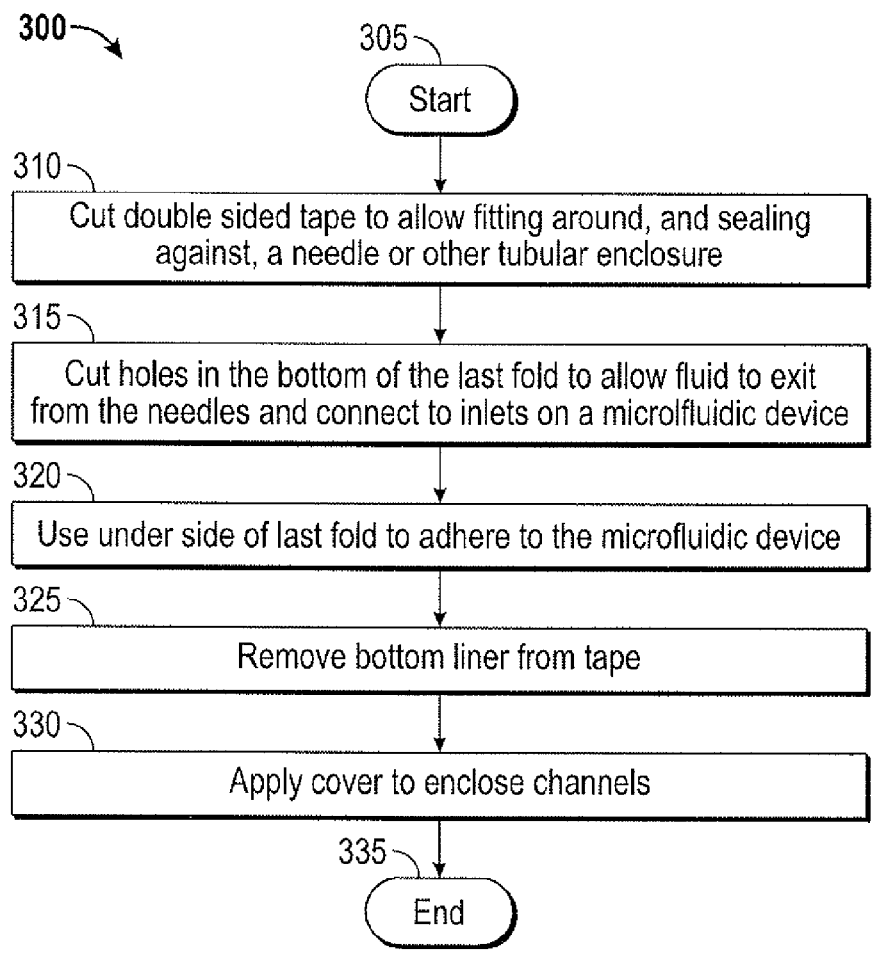
FIG. 3 depicts a detailed flow chart illustrating logical operational steps for creating a connector manifold.

In another embodiment of the present invention connector manifolds can be created by folding double-sided tape around a tubular structure, such as for example a needle, which can, in turn stick to microfluidic devices as shown by flow chart 300 in FIG. 3. This embodiment may be implemented in accordance with, or in addition to the steps illustrated in flow chart 100 and 200. This embodiment allows for rapid connections of fluid reservoirs or pneumatic pressure lines with microfluidic devices. This fabrication method can be completed very quickly, and can be configured to allow multiple simultaneous connections. The method begins at block 305.

Block 310 explains that the double-sided tape can be cut to allow fitting around and sealing against a needle. In a preferred embodiment of the invention a razor can be used to cut the double-sided tape. To improve the sealing around the needle, the cutouts can be tapered so that they are slightly larger than the needle diameter at the top (approximately 25%) and slightly smaller than the needle diameter at the bottom (approximately 25%).

In the embodiment of the invention in flow chart 300, folding lines as in flow chart 100, are used to ensure the double-sided tape can be easily folded to self align around the needle. In addition, as shown in FIG. 6b, several layers may be needed to account for the relative diameter of the needle.

Next at block 315, holes can be cut in the bottom of the last folded layer to allow fluid to exit from the needles and connect to inlets on a microfluidic device. In addition, as described at block 320, the underside of the last fold of the double-sided tape can be used to adhere to the microfluidic device. In a preferred embodiment this adhesive can be acrylic, silicone, acrylic-silicone, or other such custom adhesive.

At block 325 the bottom liner of the tape can be removed and at block 330 the folded tape can be wrapped with a cover to enclose the channels except where the tape is desired to stick to the microfluidic device. The method ends at block 335.

Figure 4:
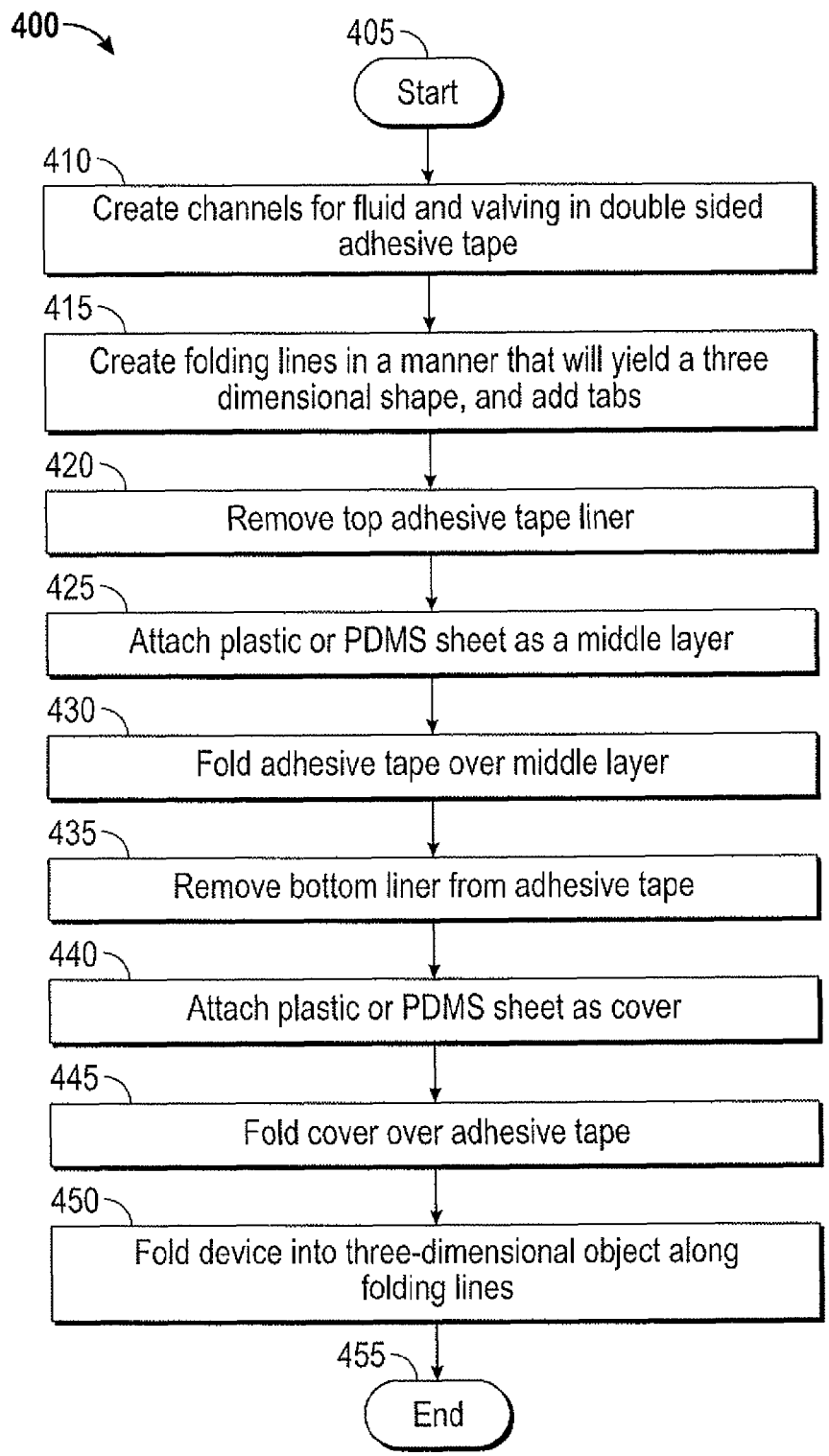
FIG. 4 depicts a detailed flow chart illustrating logical operational steps for constructing a three-dimensional microfluidic device.

FIG. 4 illustrates a high level flow chart 400 of logical operational steps for constructing a three-dimensional fluid flow object. Embodiments of the invention such as those shown in FIG. 4 have utility in creating optical patterns, signal absorbance and transmittance, or other dynamic patterns in or on an object that may contain a source or detector. It may further provide opportunity as a physical standard or phantom.

It should be noted that the method 400 disclosed herein shares several steps with, for example methods 100, 200, and 300, and is intended as an alternative embodiment of the present invention. The method 400 and FIG. 7 describe an embodiment which contains an inner and an outer fluidic layer separated by a middle layer (in this case not intended for valving). The middle layer can be a flexible membrane if valving elements are desired.

Figure 7:
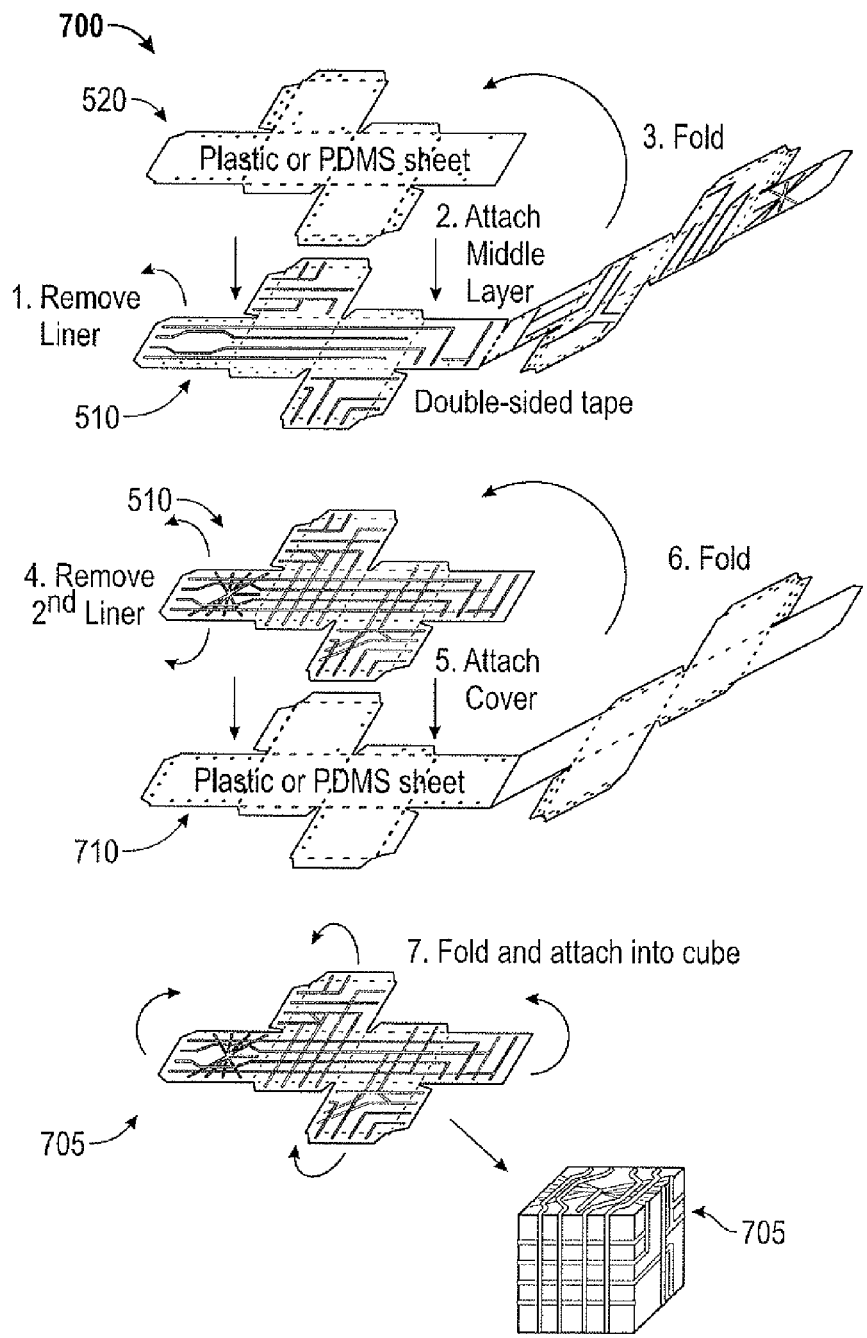
FIG. 7 depicts the construction of a three-dimensional micro fluidic device in accordance with another alternative embodiment of the invention.

The method 400 begins at block 405. Block 410 explains that layers for fluid and valving are created in a material with an adhesive layer on the top and bottom (such as double-sided tape). It should be understood that any material and/or adhesive described above with respect to FIGS. 1, 2, and 3 may equivalently be used with respect to the method 400. FIG. 7 illustrates such a product. Any number of microfluidic elements can be included on the tape.

The double-sided tape can be perforated with dots or dashes in the tape to create folding lines as described at block 415. The double-sided tape should also be formed so that when it is folded along the folding lines it will form into a three-dimensional object, such as a cube as shown in FIG. 7 as element 705.

This step also includes adding tabs along the edges of the tape. In this embodiment, in addition to facilitating folding alignment, the tabs can contain channels and open holes (vias) that connect fluid from one face of the device to another face when the faces are connected by folding. The vias in the tabs align to holes in the faces of the device in order to complete the fluidic connection of the faces.

At block 420 the top liner protecting the adhesive on the tape is removed and at block 425, a sheet of material, preferably plastic or PDMS, is attached to the top adhesive surface of the tape as a middle layer. This layer may also contain microfluidic elements such as vias to permit fluid to flow between the inner and outer layer of the device. At block 430, the double-sided tape is folded over the middle layer along the fold lines.

After the tape is folded, the liner covering the bottom (now outer) layer of adhesive on the tape can be removed as shown at block 435. Block 440 describes that a second cover is then applied over the bottom layer of adhesive to enclose the channels that have been created in the Microfluidic device. The second cover can be formed of plastic, PDMS or other such material and can contain vias to permit fluids and valving lines to connect to the device. The adhesive face of the tabs will remain uncovered such that the tape on the tabs can stick the faces together.

The device is then folded over the cover at block 445 and then folded into a three-dimensional object along the folding lines at block 450. The method results in a three-dimensional object such as the three-dimensional microfluidic cube shown in FIG. 7. The method then ends at block 455.

The resulting three-dimensional structure allows fluidic access to all the surfaces of the enclosed volume. This allows for dynamic fluid flow in three dimensions. In addition, the invention creates a three-dimensional volume that can be accessed through holes (vias) in the microfluidic layers. The three-dimensional object may enclose a volume (such as the cube shown in FIG. 7), or remain open. Both the inside and outside of the three-dimensional object are accessible by the fluids within the walls of the object. The layers can also contain pneumatic objects.

Figure 5A:
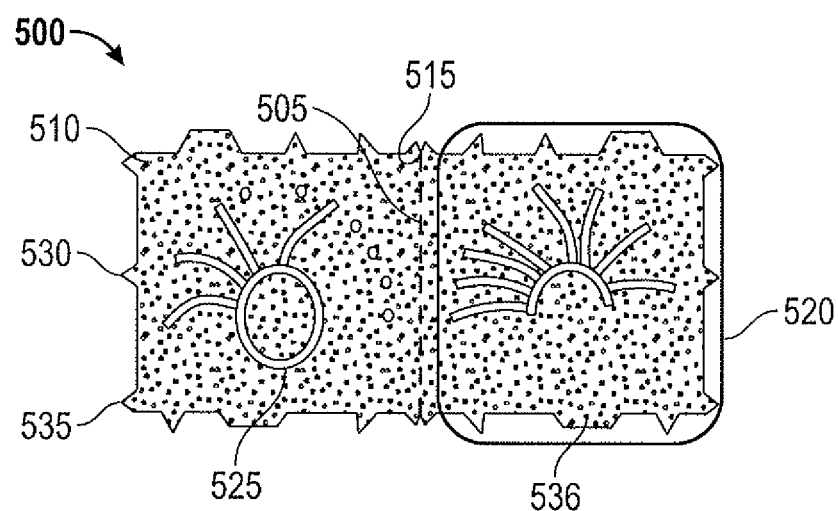
FIG. 5a depicts a microfluidic device containing fluidic channels and pull-open microvalves constructed from double-sided adhesive tape before it has been folded.
Figure 5B:
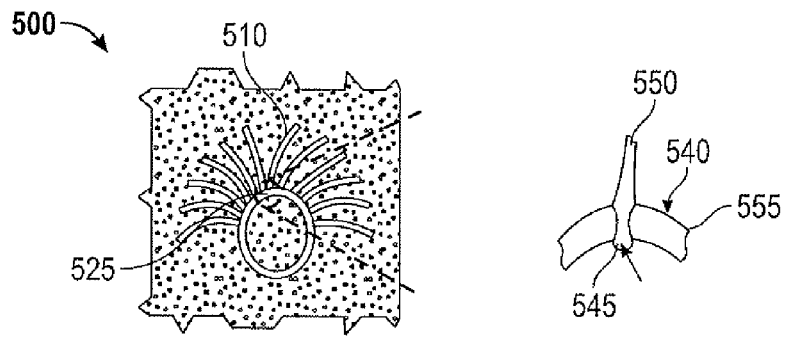
FIG. 5b depicts an exploded top view of a pull-open microfluidic valve associated with a microfluidic device constructed from double-sided adhesive tape after it has been folded together to align the fluidic channels and microvalving structures.
Figure 5C:
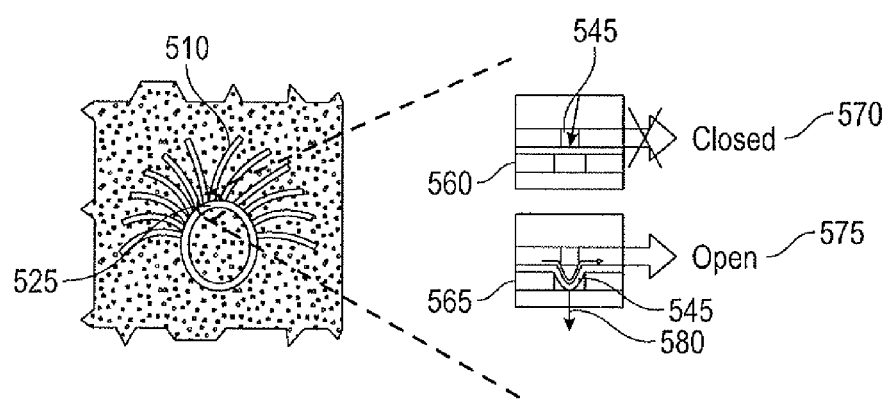
FIG. 5c depicts an exploded side view of a pull-open microfluidic valve associated with a microfluidic device constructed from double-sided adhesive tape after it has been folded together to align the fluidic channels and microvalving structures.

FIG. 5a illustrates a microfluidic device 500 in accordance with the present invention. In one embodiment dotted or dashed cuts 505 can be made in a double-sided tape, or other such material, 510 to create folding lines 515. In essence, folding lines separate different layers. Double-sided tape 510 is generally covered by a liner that must be removed before the adhesive is available. Channels 525 can be cut in the tape. It may be desirable to define multiple layers in the tape such as a valving layer 536, and a fluid layer 535.

Folding lines 515 can be used to facilitate self-alignment of the tape 510 when it is brought together to form a microfluidic device 500. A sheet of plastic or PDMS 520 can be sandwiched between the folded double-sided tape 510 to create the top and bottom of channels 525 and to serve as a pneumatic element to open and close fluid channels. The fluid channels allow fluid flow through the fluid layers 535 unless pressure actuates an aligned valve element in the valving layer 536 to stop fluid flow. Other microfluidic device components can include vias, manifolds and other fluid or pneumatic elements.

Unique tabs, such as tab 530 can be shaped into the edges of double-sided tape 510 to aid in the tactile alignment of the layers. It should be appreciated that while microfluidic device 500 is a simple device with a single fold, much more complicated devices with multiple folds and layers could be created. Tabs such as tab 530 can be important in aligning such complicated devices.

Once the Microfluidic device 500 has been folded along the folding lines 515 and around the PMDS 520, the covering over the other side of the adhesive tape can be removed and a cover (not shown) can be wrapped around the device to enclose the layers.

FIGS. 5b and 5c illustrate a detailed view of a valve that may be included in microfluidic device 500. FIG. 5b illustrates a top view of a pull-open microfluidic valve 540, created in double-sided tape 510. Note that in FIGS. 5b and 5c, fluid layer 535 and valving layer 536 have been folded together to create the microfluidic device. The top view of the microfluidic valve illustrates a detailed view of the valve including the valve seat 545, fluid channel 555, and valve channel 550.

FIG. 5c illustrates two side views of a pull-open microfluidic valve 540. The valve seat 545 is held closed in the upper view 560. In upper view 560, the valve does not allow fluid flow as illustrated by arrow and label "closed" 570. In lower view 565, suction 580 holds the valve seat 545 open so that fluid can flow as illustrated by arrow and label "open" 575.

Figure 6A:
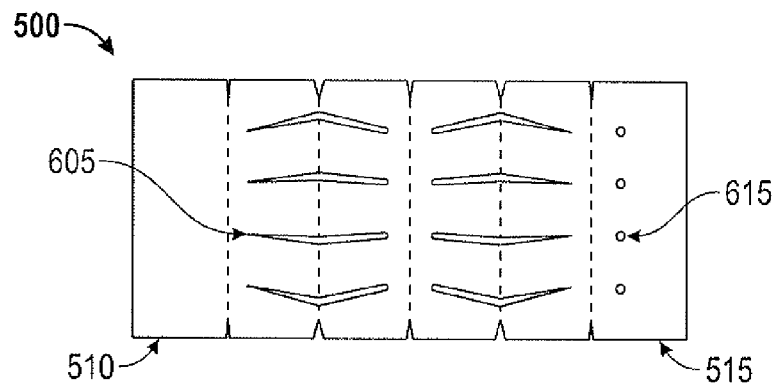
FIG. 6a depicts a microfluidic device comprising a connector manifold before it has been folded in accordance with an alternative embodiment of the invention.
Figure 6B:
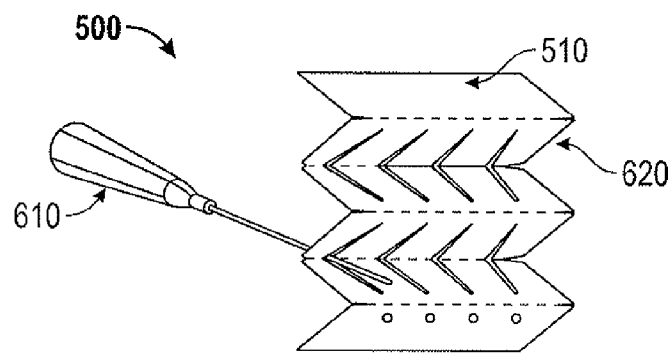
FIG. 6b depicts a microfluidic device comprising a connector manifold being folded around a needle in accordance with an alternative embodiment of the invention.

FIG. 6a illustrates a microfluidic device 500 comprising a connector manifold to seal around tubular structures such as needles and to provide a fluidic connection to remaining elements of the device. The double-sided tape 510 can be patterned with folding lines 515. In addition, the tape is cut with fittings 605. Fittings 605 can be cut to be slightly larger than the needle 610 diameter at the top to slightly smaller than the needle 610 diameter at the bottom. In a preferred embodiment, the fitting size is 25% greater than the needle diameter at the top and 25% less than the needle diameter at the bottom.

Double-sided tape 510 also includes a hole 615 in the bottom of the last folded layer to allow fluid to exit the needles and connect with the microfluidic device. The present embodiment allows for a rapid connection of a fluid source and can withstand a relatively high pressure. Thirty pounds per square inch of fluid pressure on a 21 gauge needle is readily achievable.

FIG. 6b illustrates the present embodiment of a microfluidic device. It may be necessary to include multiple layers 620 so that the double-sided tape 515 is folded to be thick enough to enclose the needle 610 as shown in FIG. 6b.

Figure 6C:
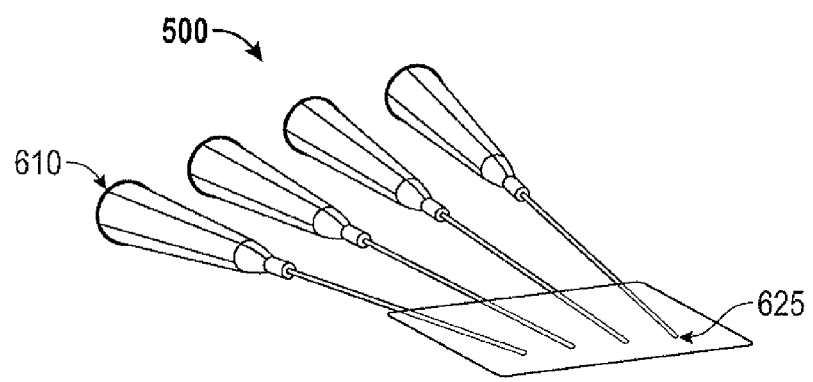
FIG. 6c depicts a microfluidic device comprising a plurality of connector manifolds folded around needles in accordance with an alternative embodiment of the invention.

FIG. 6c illustrates a completed microfluidic device 500 in accordance with the present embodiment. It should be noted that, as shown in FIG. 6c a number of needles 610 can be connected to the microfluidic device via inlet 625. In addition, the embodiment is both reusable and removable if necessary. These manifolds can also be fabricated as part of a single microfluidic system.

FIG. 7 illustrates steps 700 for forming a three-dimensional microfluidic device 705 which contains two fluidic layers (an inner and an outer layer) that can be connected through vias in the middle layer 520. The microfluidic device 705 provides fluidic access to all of the surface around and enclosing a volume. As with the other embodiments of the present invention, the double-sided tape or other such material 510 must be shaped correctly so that the folds along fold lines 515 result in the desired three-dimensional object 705. This may include forming the double-sided tape 510 to be foldable into a three-dimensional shape and cutting folding lines 515.

At step 1 the liner on one face of the double-sided tape is removed. Then at step 2 a middle layer formed of plastic or PDMS sheet 520 is attached to half of the 3D object. Next at step 3, the double-sided tape 510 is folded on itself and around the middle layer 520 as shown. The underside (now outside) of the double-sided tape has a liner, which is also removed at step 4, and a plastic or PDMS sheet 710 is attached as a cover at step 5. The device, which includes tape 510, is then further folded at step 6 to enclose the channels. The cover 710 can also contain vias which facilitate fluidic and pneumatic elements entering the device from the outside or accessing the inner volume of the device.

The double-sided tape 510 is now ready to be folded into a three-dimensional microfluidic device 705, as shown at step 7. The final product is a three-dimensional microfluidic device 705. While the microfluidic device 705 is illustrated as a cube it should be appreciated that any number of other shapes can easily be formed according to the illustrated steps.

Based on the foregoing, it can be appreciated that a number of embodiments, preferred and alternative, are disclosed herein. For example, in one embodiment, a method for fabricating microfluidic devices comprises creating folding lines in a sheet of material and forming a plurality of microfluidic device components in the material. The material is then folded at the fold lines. This folded material is then adhered together to thereby create a self-aligned microfluidic device.

The microfluidic device can comprise a plurality of layers of the material wherein the layers comprise at least one of polymers, plastics, elastomers, paper, adhesive layers, liners, foil, porous materials, glasses, and composites. The material is adhered using at least one of adhesive tapes, chemical adhesive, mechanical pressure, electrostatic attraction, melting, curable adhesive, epoxy, and urethane.

Forming the microfluidic device components further comprises forming at least one valve in at least one of the layers, such that the valve acts upon a fluid carried in one of the layers adjacent to the valve. A plurality of microfluidic device components are arranged in the material, and parts of the material are removed to form the microfluidic device components. A flexible membrane is inserted and the material is folded over the flexible membrane to create at least one microfluidic valve. The microfluidic valve can be a pull-open valve or a push-closed valve.

In an alternative embodiment of the invention sections of the material are removed to fit around and seal against at least one tubular enclosure. Next fold lines are arranged to provide self alignment around the tubular enclosure. Cutting at least one slot in the bottom of the last folded layer thereby creates a fluidic connection between an inlet or outlet of the microfluidic device and the tubular enclosure to allow a fluid to flow from the tubular enclosure to the inlet or outlet of the microfluidic device.

An alternative embodiment of the invention comprises arranging the fold lines to form a three dimensional shape by folding the material along the fold lines to form a three dimensional object comprised of the material wherein both the inside and outside surface of the three dimensional object are accessible by a fluid held in the walls of the three dimensional object. A plurality of properties of the fluid in the walls of the three dimensional object can be manipulated at different positions of the three dimensional object. These properties comprise at least one of fluid contents, flow rates, temperatures, viscosities, opacities, and fluid mixings.

In another embodiment of the invention a plurality of tabs are arranged on the material to provide an alignment guide when the material is folded at the fold lines.

In yet another embodiment of the invention a method for fabricating microfluidic devices comprises creating at least one folding line in a sheet of material, forming a plurality of microfluidic device components in the material, arranging a plurality of tabs on the material to provide an alignment guide, folding the material at the fold lines and according to the alignment guide, and adhering the folded material together to thereby create a self-aligned multilayered microfluidic device.

The method further comprises configuring the microfluidic device as a plurality of layers of the material, forming at least one valve in at least one of the layers, such that the valve acts upon at least one fluid carried in at least one of the layers adjacent to the valve, arranging a plurality of microfluidic device components in the material, removing parts of the material to form a plurality of microfluidic device components, arranging a flexible membrane, and folding the material over the flexible membrane to create at least one microfluidic valve. The microfluidic valve comprises at least one of a pull-open valve or a push-closed valve.

In an alternative embodiment of the invention sections of the material are removed to fit around and seal against at least one tubular enclosure. Next fold lines are arranged to provide self alignment around the tubular enclosure. Cutting at least one slot in the bottom of the last folded layer thereby creates a fluidic connection between an inlet of the microfluidic device and the tubular enclosure to allow a fluid to flow from the tubular enclosure to the inlet of the microfluidic device.

Another alternative embodiment of the invention comprises arranging the fold lines to form a three dimensional shape, folding the material along the fold lines to form a three dimensional object comprised of the material wherein both an inside surface of the three dimensional object and an outside surface of the three dimensional object are accessible by a fluid held in a wall of the three dimensional object. A plurality of properties of the fluid in the walls of the three dimensional object can be manipulated at different positions of the three dimensional object, those properties comprising at least one of fluid contents, flow rates, temperatures, viscosities, opacities, and fluid mixings.

In yet another embodiment a microfluidic device comprises a material configured to have a plurality of folding lines. A plurality of microfluidic device components are formed in the material. A plurality of tabs on the material provide an alignment guide when the material is folded at the fold lines. An adhesive binds the material after it is folded at the plurality of folding lines and adhered together to create a self-aligned multilayered microfluidic device.

The device further comprises a plurality of layers of the material wherein the layers comprise at least one of polymers, plastics, elastomers, paper, adhesive layers, liners, foil, porous, materials, glasses, and composites. The adhesive comprises at least one of adhesive tapes, chemical adhesive, mechanical pressure, electrostatic attraction, melting, curable adhesive, epoxy, and urethane.

In another embodiment the device further comprises at least one valve in at least one of the layers, such that the valve acts upon at least one fluid carried in the layers adjacent to the at least one valve. The material around the plurality of microfluidic device components is removed. A flexible membrane sealed between the at least two layers thereby creates at least one microfluidic valve. The valve can be a pull-open valve or a push-closed valve.

In another embodiment the device comprises the material formed with removed sections configured to fit around and seal against at least one tubular enclosure wherein the fold lines provide self alignment around the tubular enclosure. At least one slot is formed in a bottom of the last folded layer to thereby create a fluidic connection between an inlet of the microfluidic device and the at least one tubular enclosure, to allow a fluid to flow from the at least one tubular enclosure to the inlet of the microfluidic device.

In another embodiment the device comprises a three dimensional shape formed by the arrangement of the fold lines wherein the material is folded along the fold lines to form walls of a three dimensional object. A fluid is associated with the microfluidic device wherein in both an inside surface of the three dimensional object and an outside surface of the three dimensional object are accessible by the fluid held in the walls of the three dimensional object.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A method for fabricating microfluidic valves comprising:
    forming at least one valving layer in a sheet of material wherein said sheet of material comprises sections separated by at least one perforated fold line forming a plurality of layers;
    forming at least one microchannel in said at least one valving layer wherein said at least one microchannel delivers pneumatic pressure to actuate at least one microfluidic valve formed in said sheet of material
    forming at least one fluid layer in said sheet of material;
    forming at least one microchannel in said at least one fluid layer wherein said at least one microchannel carries fluid;
    installing a flexible membrane on said sheet of material;
    folding said sheet of material said at least one perforated fold line separating said at least one valving layer and said at least one fluid layer around said flexible membrane; and
    adhering said folded material together around said flexible membrane wherein said plurality of layers comprise at least one of: double sided tape; elastomers; paper; adhesive layers; liners; foil; porous materials; glasses; and composites and wherein said material is adhered by at least one of: adhesive tapes; chemical adhesive; mechanical pressure; electrostatic attraction; melting; curable adhesive; epoxy; and urethane.

2. The method of claim 1 wherein said microfluidic valve comprises at least one of:
    a pull-open valve; or
    a push-closed valve.

3. The method of claim 2 further comprising:
    coating a valve seat associated with said pull-open valve with at least one of Teflon, PDMS, or oil in order to ensure said flexible membrane does not stick.

4. The method of claim 1 further comprising:
    arranging said perforated fold lines to form a plurality of walls of a secondary three dimensional shape wherein said three dimensional shape encloses a voided volume;
    folding said material along said perforated fold lines to form said plurality of walls of said secondary three dimensional object wherein both an inside surface of said three dimensional object and an outside surface of said walls of said three dimensional object are accessible by a fluid held in said walls of said three dimensional object.

5. The method of claim 4 wherein a plurality of properties of said fluid in said walls of said three dimensional object can be manipulated at different positions of said three dimensional object, said properties comprising at least one of:
    fluid contents,
    flow rates,
    temperatures,
    viscosities,
    opacities, and
    fluid mixings.

6. The method of claim 1 further comprising arranging a plurality of tabs on said material to provide an alignment guide across said perforated fold lines when said material is folded at said perforated fold lines.

7. A method for fabricating microfluidic valves associated with a microfluidic device comprising:
    forming at least one valving layer in a sheet of material wherein said sheet of material comprises sections separated by at least one perforated fold line forming a plurality of layers;

configuring said microfluidic device as a plurality of layers of said material;

forming at least one microchannel in said at least one valving layer wherein said at least one microchannel delivers pneumatic pressure to actuate at least one microfluidic valve formed in said sheet of material wherein said microfluidic valve comprises at least one of a pull-open valve or a push-closed valve;

forming at least one fluid layer in said sheet of material;

forming at least one microchannel in said at least one fluid layer wherein said at least one microchannel carries fluid;

arranging a plurality of tabs on said material to provide an alignment guide across said perforated fold lines;

installing a flexible membrane on said sheet of material;

folding said sheet of material at said at least one perforated fold line separating said at least one valving layer and said at least one fluid layer around said flexible membrane and according to said alignment guide; and adhering said folded material together around said flexible membrane.

8. The method of claim 7 further comprising:

removing sections of said material to fit around and seal against at least one tubular enclosure comprising a needle;

arranging said perforated fold lines to provide self alignment around said at least one tubular enclosure comprising a needle;

cutting at least one slot in a bottom of said last folded layer to thereby create a fluidic connection between an inlet of said microfluidic device and said at least one tubular enclosure comprising a needle to allow a fluid to flow from said at least one tubular enclosure comprising a needle to said inlet of said microfluidic device.

9. The method of claim 7 further comprising:

arranging said perforated fold lines to form a plurality of walls of a secondary three dimensional shape;

folding said material along said perforated fold lines to form said plurality of walls of said secondary three dimensional object wherein both an inside surface of said three dimensional object and an outside surface of said three dimensional object are accessible by a fluid held in said walls of said three dimensional object, wherein a plurality of properties of said fluid in said walls of said three dimensional object can be manipulated at different positions of said three dimensional object, said properties comprising at least one of:

fluid contents,
flow rates,
temperatures,
viscosities,
opacities, and
fluid mixings.

10. A microfluidic device comprising:

a sheet of material comprising at least one valving layer and at least one fluid layer wherein at least one perforated folding line separates sections of said sheet of material from said valving layer and said fluid layer;

at least one microchannel formed in said at least one fluid layer wherein said at least one microchannel carries fluid;

at least one microchannel formed in said at least one valving layer wherein said at least one microchannel delivers pneumatic pressure to actuate at least one microfluidic valve formed in said sheet of material;

a flexible membrane attached to a top surface of said sheet of material;

a plurality of tabs on said sheet of material to provide an alignment guide across said perforated fold lines when said sheet of material is folded at said perforated fold lines; and an adhesive, wherein said sheet of material is folded around said flexible membrane, at said plurality of perforated folding lines and adhered together around said flexible membrane with said adhesive wherein said adhesive comprises at least one of: adhesive tapes; chemical adhesive; mechanical pressure; electrostatic attraction; melting; curable adhesive; epoxy; and urethane.

11. The device of claim 10 wherein said layers comprise at least one of:

double sided tape;
elastomers;
paper;
adhesive layers;
liners;
foil;
porous materials;
glasses; and
composites.

12. The device of claim 10 wherein said microfluidic valve comprises at least one of:

a pull-open valve; or
a push-closed valve.

13. The device of claim 10 further comprising:

a coating comprising at least one of Teflon, PDMS, or oil coated on a valve seat associated with said pull-open valve configured to ensure said flexible membrane does not stick.

14. The device of claim 10 further comprising:

a secondary three dimensional shape formed by the arrangement of said perforated fold lines wherein said material is folded along said perforated fold lines to form walls of a secondary three dimensional object; and a fluid associated with said microfluidic device, wherein both an inside surface of said walls of said three dimensional object and an outside surface of said walls of said three dimensional object are accessible by said fluid wherein said fluid is held in said walls of said three dimensional object.

* * * * *